(12) United States Patent
Arndt et al.

(10) Patent No.: US 7,015,140 B2
(45) Date of Patent: Mar. 21, 2006

(54) SELECTIVE SALICIDATION METHODS

(75) Inventors: Russell H. Arndt, Fishkill, NY (US); Kenneth J. Giewont, Hopewell Junction, NY (US); Kevin E. Mello, Fishkill, NY (US); M. Dean Sciacca, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/710,131

(22) Filed: Jun. 21, 2004

(65) Prior Publication Data

US 2005/0282370 A1 Dec. 22, 2005

(51) Int. Cl.
*H01L 21/44* (2006.01)
*H01L 21/4763* (2006.01)

(52) U.S. Cl. ........................ 438/682; 438/651; 438/655

(58) Field of Classification Search ................ 438/682, 438/303, 286, 583, 244, 281, 200, 651, 655, 438/768
See application file for complete search history.

(56) References Cited

U.S. PATENT DOCUMENTS

| 5,342,798 A | 8/1994 | Huang |
| 6,387,804 B1 * | 5/2002 | Foster ........................ 438/682 |
| 2002/0111021 A1 * | 8/2002 | Paton et al. ................. 438/682 |

* cited by examiner

*Primary Examiner*—Walter L. Lindsay, Jr.
(74) *Attorney, Agent, or Firm*—Lisa U. Jaklitsch; Hoffman, Warnick & D'Alessandro LLC

(57) ABSTRACT

Methods for selective salicidation of a semiconductor device. The invention implements a chemical surface pretreatment by immersion in ozonated water $H_2O$ prior to metal deposition. The pretreatment forms an interfacial layer that prevents salicidation over an n-type structure. As a result, the invention does not add any additional process steps to the conventional salicidation processing.

20 Claims, 2 Drawing Sheets

SELECTIVE SALICIDATION METHODS

BACKGROUND OF INVENTION

1. Technical Field

The present invention relates generally to complementary metal-oxide semiconductor (CMOS) chip manufacturing, and in particular, to the process area for forming ohmic contacts to devices using self-aligning silicide (salicide) processing.

2. Related Art

Formation of ohmic contacts to devices using self-aligning silicide (silicide) processing is a common semiconductor fabrication step. During this process, it is oftentimes advantageous to form silicide a p-type structure such as a field effect transistor (PFET), and not an n-type structure such as an NFET. Typically, however, selectively siliciding p+ silicon (Si) material requires additional blocking photomask levels, which adds many steps to the process and thus adds complexity.

In one approach, disclosed in U.S. Pat. No. 5,342,798 to Huang, selective salicidation of source/drain regions of a transistor is performed by implanting into a first set of source/drain (S/D) regions to increase a doping density thereof. All source/drain regions are then annealed to form to oxidization regions; a thinner oxidation region is formed over the first set of S/D regions. A metal layer is then formed over the oxidation regions and annealed to form metal-silicide over only the thinner oxidation region. The unreacted metal is then stripped. Since this approach requires an implant and anneal step, the process is greatly complicated. In addition, the selectiveness of this approach does not delineate between n-type and p-type structures, which limits its applicability.

In view of the foregoing, there is a need in the art for a way to selectively silicide p-type structures and not n-type structures.

SUMMARY OF INVENTION

The present invention includes methods for selective salicidation of a semiconductor device. The invention implements a chemical surface pretreatment by immersion in ozonated water $H_2O$ prior to metal deposition. The pretreatment forms an interfacial layer that prevents salicidation over an n-type structure. As a result, the invention does not add any additional process steps to the conventional salicidation processing.

A first aspect of the invention is directed to a method for selective salicidation of a semiconductor device, the method comprising the steps of: providing a first structure having an n-type dopant therein and a second structure having a p-type dopant therein; exposing at least the first structure to an ozonated water bath; and salicidizing the first and second structure whereby silicide is formed only over the second structure.

A second aspect of the invention is directed to a method for selectively forming silicide on a semiconductor device, the method comprising the steps of: providing a PFET and an NFET; and chemically pretreating at least the NFET to prevent silicide formation on the NFET.

A third aspect of the invention is directed to a method of forming a silicide portion of a semiconductor, the method comprising the steps of: providing a first structure having an n-type dopant therein and a second structure having a p-type dopant therein; chemically pretreating at least the NFET to prevent silicide formation on the NFET; and salicidizing the first and second structure whereby silicide is formed only over the second structure.

The foregoing and other features of the invention will be apparent from the following more particular description of embodiments of the invention.

BRIEF DESCRIPTION OF DRAWINGS

The embodiments of this invention will be described in detail, with reference to the following figures, wherein like designations denote like elements, and wherein.

DETAILED DESCRIPTION

Figure 1:
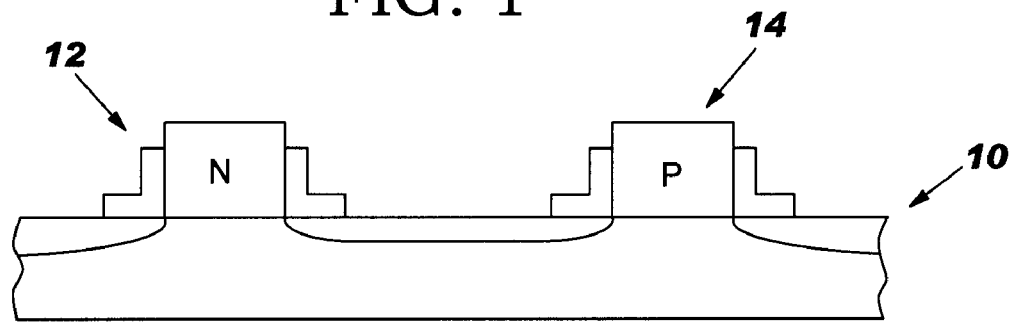
FIG. 1 shows a first step of a method for selective salicidation.

With reference to the accompanying drawings, FIGS. 1–4 illustrate a method for selective salicidation of a semiconductor device 10. As shown in FIG. 1, a first step includes forming (or providing) a first structure 12 having an n-type dopant at the surface in a p-type well, and a second structure 14 having a p-type dopant at the surface in a n-type well. The n-type dopant may include, for example, phosphorous and/or arsenic, and the p-type dopant may include, for example, boron and/or boron di-flouride. In one embodiment, first structure 12 is an n-type field effect transistor (NFET) 12 and second structure 14 is a p-type FET (PFET). It should be recognized, however, that structures 12, 14 may be any type of doped structure upon which selective salicidation is desired. First and second structure 12, 14 may be formed by any now known or later developed processing. For example, formation of the actual structures 12, 14, and then doping by implanting the particular dopants. In the case that structures are an NFET 12 and a PFET 14, the source, drain and gate are doped.

Figure 2:
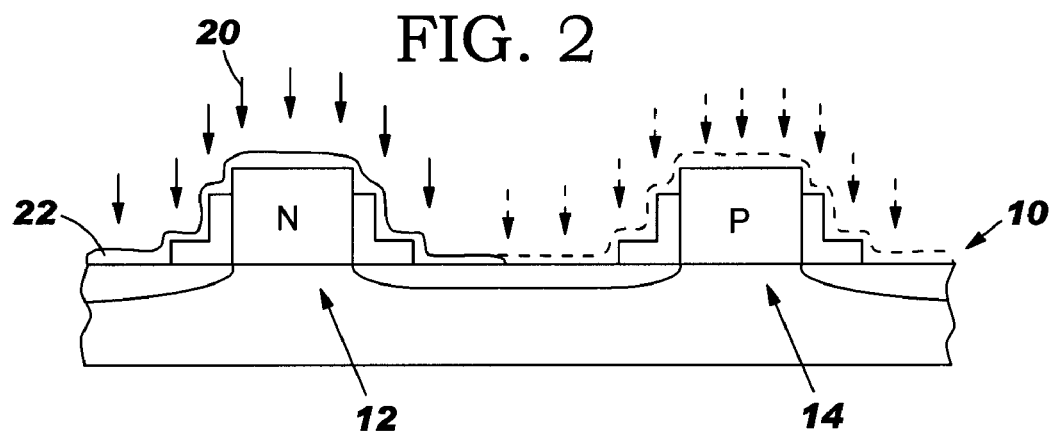
FIG. 2 shows a second step of the method.

In a second step, shown in FIG. 2, at least first structure 12 is chemically pretreated so as to prevent silicide formation thereon. In one embodiment, this step includes exposing at least first structure 12 to an ozonated water bath 20, perhaps as part of conventional hydrofluoric acid (HF) processing. As indicated in FIG. 2 by dashed lines, the exposure may be applied to second structure 14 also. Ozonated water bath 20 includes no less than approximately 1 parts per million (ppm) and no greater than approximately 25 ppm of ozone ($O_3$), and preferably approximately 5 ppm of ozone ($O_3$). In one embodiment, exposure may occur at a rate of approximately 30 standard liters per minute (slpm) of water ($H_2O$) for no less than approximately 0.1 minutes and no greater than 10 minutes, and preferably for approximately 5 minutes. As shown in FIG. 2, the exposing step generates an interfacial layer 22 only on n-type structure 12, which prevents silicide formation.

Figure 3:
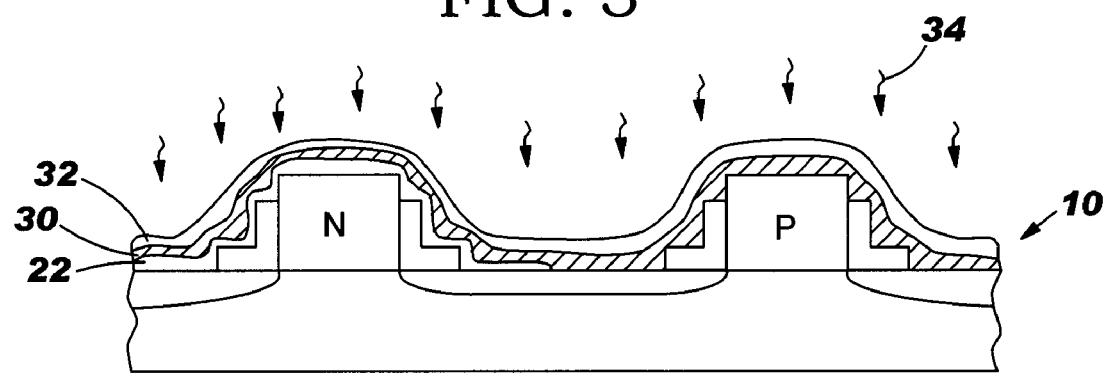
FIG. 3 shows a third step of the method.

In a third step, shown in FIG. 3, salicidation of first structure 12 and second structure 14 is conducted. Salicidation may include any now known or later developed steps for forming self-aligned silicide. In one embodiment, the salicidation step includes: depositing a metal layer 30; depositing a cap layer 32 on metal layer 30; annealing 34 to form a silicide; and then removing cap layer 32 and excess metal layer to arrive at semiconductor device 40, shown in FIG. 4. In one example salicidation, metal layer 30 may be sputter deposited cobalt (Co) having a thickness of approximately 80 Angstroms (A), and cap layer 32 may be titanium-nitride (TiN) having a thickness of approximately 200 A. Annealing may occur in a nitrogen ($N_2$) atmosphere at approximately 545° C. for approximately 60 seconds. Removing excess metal layer 30 and cap layer 32 may include wet etching. Subsequent processing may include a high temperature anneal (e.g., at 700° C.) for disilicide conversion.

Figure 4:
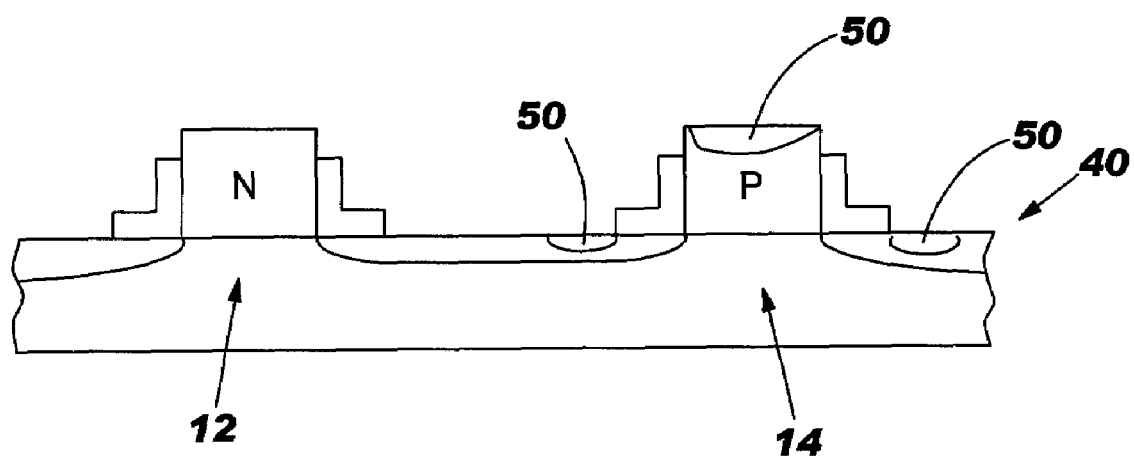
FIG. 4 shows a semiconductor device fabricated using the methods of FIGS. 1–3.

As shown in FIG. 4, the result is the formation a silicide layer 50 over second structure 14 only. Based on the above illustrative layer thicknesses and process, an approximately 280 A thick layer of cobalt silicide on second structure 14 would be formed, while first structure 12 has no silicide formed thereon. Silicide layer 50 over second structure 14 has a sheet resistance (Rs) of approximately 7 Ohms/square, while first structure 14 has an Rs of approximately 100 Ohms/square.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

The invention claimed is:

1. A method for selective salicidation of a semiconductor device, the method comprising the steps of:
   providing a first gate structure having an n-type dopant therein and a second gate structure having a p-type dopant therein;
   exposing only the first gate structure to an ozonated water bath; and
   salicidizing the first and second gate structure whereby silicide is formed only over the second gate structure.

2. The method of claim 1, wherein the ozonated water bath includes no less than approximately 1 parts per million (ppm) and no greater than approximately 25 ppm of ozone ($O_3$).

3. The method of claim 2, wherein the ozonated water bath includes approximately 5 ppm of ozone ($O_3$).

4. The method of claim 1, wherein the exposing step includes exposing to ozonated water bath at a rate of approximately 30 standard liters per minute (slpm) of water ($H_2O$).

5. The method of claim 1, wherein the exposing step is conducted for no less than approximately 0.1 minutes and no greater than 10 minutes.

6. The method of claim 1, wherein the n-type dopant includes at least one of phosphorous and arsenic, and the p-type dopant includes at least one of boron and boron di-flouride.

7. The method of claim 1, wherein the exposing step generates an interfacial layer.

8. The method of claim 1, wherein the saliciding step includes:
   depositing a metal layer;
   depositing a cap layer on the metal layer;
   annealing to form a silicide; and
   removing the cap layer and excess metal layer.

9. A method for selectively forming silicide on a semiconductor device, the method comprising the steps of:
   providing a PFET and an NFET; and
   chemically pretreating only the NFET to prevent silicide formation on the NFET.

10. The method of claim 9, wherein the pretreating step includes exposing at least the NFET to an ozonated water bath including no less than approximately 1 parts per million (ppm) and no greater than approximately 25 ppm of ozone ($O_3$).

11. The method of claim 10, wherein the exposing step generates an interfacial layer.

12. The method of claim 10, wherein the exposing step includes exposing to the ozonated water bath at a rate of approximately 30 standard liters per minute (slpm) of water ($H_2O$) for approximately 5 minutes.

13. A method of forming a silicide portion of a semiconductor, the method comprising the steps of:
   providing a first gate structure having an n-type dopant therein and a second gate structure having a p-type dopant therein;
   chemically pretreating only the first gate structure to prevent silicide formation on the first gate structure; and
   salicidizing the first and second gate structure whereby silicide is formed only over the second gate structure.

14. The method of claim 13, wherein the pretreating step includes exposing at least the first structure to an ozonated water bath.

15. The method of claim 14, wherein the ozonated water bath includes no less than approximately 1 parts per million (ppm) and no greater than approximately 25 ppm of ozone ($O_3$).

16. The method of claim 15, wherein the ozonated water bath includes approximately 5 ppm of ozone ($O_3$).

17. The method of claim 14, wherein the exposing step generates an interfacial layer.

18. The method of claim 14, wherein the exposing step includes exposing to the ozonated water bath at a rate of approximately 30 standard liters per minute (slpm) of water ($H_2O$) for no loss than approximately 0.1 minutes and no greater than 10 minutes.

19. The method of claim 13, wherein the n-type dopant includes at least one of phosphorous and arsenic, and the p-type dopant includes at least one of boron and boron di-flouride.

20. The method of claim 13, wherein the salicidizing step includes:
   depositing a metal layer;
   depositing a cap layer on the metal layer;
   annealing to form a silicide; and
   removing the cap layer and excess metal layer.

* * * * *

UNITED STATES PATENT AND TRADEMARK OFFICE
CERTIFICATE OF CORRECTION

| | | |
|---|---|---|
| PATENT NO. | : 7,015,140 B2 | Page 1 of 1 |
| APPLICATION NO. | : 10/710131 | |
| DATED | : 3/21/2006 | |
| INVENTOR(S) | : Arndt, et al | |

It is certified that error appears in the above-identified patent and that said Letters Patent is hereby corrected as shown below:

Claim 18, column 4, line 42, remove "loss" and insert --less--.

Signed and Sealed this

Twenty-fifth Day of July, 2006

JON W. DUDAS
*Director of the United States Patent and Trademark Office*